United States Patent
Pillow

(10) Patent No.: US 9,543,522 B2
(45) Date of Patent: Jan. 10, 2017

(54) ELECTROLUMINESCENT DEVICE

(75) Inventor: Jonathan Pillow, Stotfold (GB)

(73) Assignee: Cambridge Display Technology, Ltd., Godmanchester (GB)

( * ) Notice: Subject to any disclaimer, the term of this patent is extended or adjusted under 35 U.S.C. 154(b) by 763 days.

(21) Appl. No.: 13/820,055

(22) PCT Filed: Sep. 2, 2011

(86) PCT No.: PCT/GB2011/001292
§ 371 (c)(1),
(2), (4) Date: Apr. 23, 2013

(87) PCT Pub. No.: WO2012/028853
PCT Pub. Date: Mar. 8, 2012

(65) Prior Publication Data
US 2013/0200352 A1    Aug. 8, 2013

(30) Foreign Application Priority Data
Sep. 2, 2010    (GB) .................................. 1014571.2

(51) Int. Cl.
| | |
|---|---|
| *H01L 51/54* | (2006.01) |
| *H01L 51/00* | (2006.01) |
| *C09K 11/06* | (2006.01) |
| *H05B 33/14* | (2006.01) |
| *C08L 65/00* | (2006.01) |
| *H01L 27/32* | (2006.01) |
| *H01L 51/50* | (2006.01) |
| *H01L 51/56* | (2006.01) |

(52) U.S. Cl.
CPC ........... *H01L 51/0039* (2013.01); *C08L 65/00* (2013.01); *C09K 11/06* (2013.01); *H01L 51/0007* (2013.01); *H01L 51/0053* (2013.01); *H05B 33/14* (2013.01); *C08G 2261/148* (2013.01); *C08L 2205/02* (2013.01); *C09K 2211/1416* (2013.01); *H01L 27/3241* (2013.01); *H01L 51/5012* (2013.01); *H01L 51/5048* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2004/0214036 A1 | 10/2004 | Bentsen et al. | |
| 2007/0075626 A1* | 4/2007 | Yu | H01L 27/3244 313/500 |
| 2011/0037058 A1* | 2/2011 | Buchholz | C08F 214/18 257/40 |

FOREIGN PATENT DOCUMENTS

| | | | | |
|---|---|---|---|---|
| EP | 2224510 A1 | 9/2010 | | |
| JP | 2002-216956 A | 8/2002 | | |
| JP | 2009-191232 A | 8/2009 | | |
| WO | WO 02/090416 A1 | 11/2002 | | |
| WO | WO 2004/041902 A2 | 5/2004 | | |
| WO | WO 2007/126929 A2 | 11/2007 | | |
| WO | WO 2009053089 A1 * | 4/2009 | ............ | C08G 61/12 |
| WO | WO 2011050048 A2 * | 4/2011 | ........... | G03F 7/0046 |

OTHER PUBLICATIONS

Search Report for corresponding Great Britain Application No. GB1014571.2, dated Jan. 26, 2011, pp. 1, 2,32 and 33.

* cited by examiner

*Primary Examiner* — Andrew K Bohaty
(74) *Attorney, Agent, or Firm* — Wolf, Greenfield & Sacks, P.C.

(57) ABSTRACT

An electroluminescent device (20) having a first layer comprising a fluorinated first organic compound with one or more fluorene residues and soluble in a fluorinated solvent, the first layer being adjacent to a second layer having second organic compound that is insoluble in a fluorinated solvent, and methods and materials for making said device.

23 Claims, 1 Drawing Sheet

ELECTROLUMINESCENT DEVICE

RELATED APPLICATIONS

The present application is a national stage filing under 35 U.S.C. §371 of international PCT application, PCT/GB2011/001292, filed Sep. 2, 2011, which claims priority to United Kingdom patent application, GB 1014571.2, filed Sep. 2, 2010, each of which is incorporated herein by reference.

The present invention relates to electroluminescent devices, for example those which have adjacent organic emitter and electron transfer layers, and methods and materials for manufacturing such device.

With reference to FIG. 1, the architecture of an electroluminescent device according to the invention comprises a transparent glass or plastic substrate 1, an anode 2 of indium tin oxide and a cathode 4. An electroluminescent layer 3 is provided between anode 2 and cathode 4.

In a practical device, at least one of the electrodes is semi-transparent in order that light may be absorbed (in the case of a photoresponsive device) or emitted (in the case of an OLED). Where the anode is transparent, it typically comprises indium tin oxide.

Further layers may be located between anode 2 and cathode 3, such as charge transporting, charge injecting, or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), polyaniline as disclosed in U.S. Pat. No. 5,723,873 and U.S. Pat. No. 5,798,170, and poly(thienothiophene). Exemplary acids include PEDT doped with polystyrene sulfonate (PSS) as disclosed in EP 0901176 and EP 0947123, polyacrylic acid or a fluorinated sulfonic acid, for example Nafion®.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 3-3.5 eV.

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semiconducting host matrix. Alternatively, the electroluminescent material may be covalently bound to a charge transporting material and/or host material.

Electroluminescent layer 3 may be patterned or unpatterned. A device comprising an unpatterned layer may be used an illumination source, for example. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Suitable electroluminescent dendrimers for use in layer 3 include electroluminescent metal complexes bearing dendrimeric groups as disclosed in, for example, WO 02/066552.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258 or barium fluoride as disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula VIII:

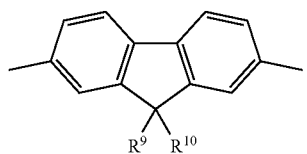

(VIII)

wherein $R^9$ and $R^{10}$ are independently selected from hydrogen or optionally substituted alkyl, alkoxy, aryl, arylalkyl, heteroaryl and heteroarylalkyl. More preferably, at least one of $R^9$ and $R^{10}$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilised to provide electron transport.

a copolymer comprising a first repeat unit and a triarylamine repeat unit, in particular a repeat unit selected from formulae 1-6, may be utilised to provide hole transport and/or emission:

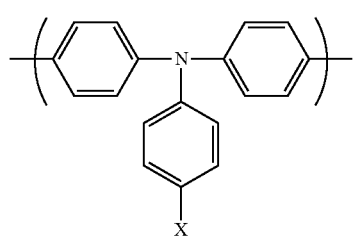

1

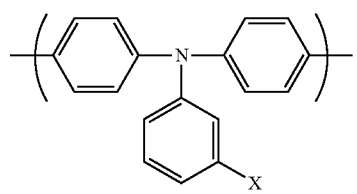

2

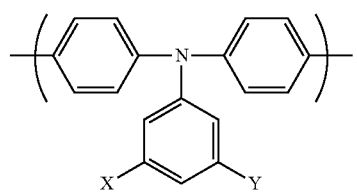

3

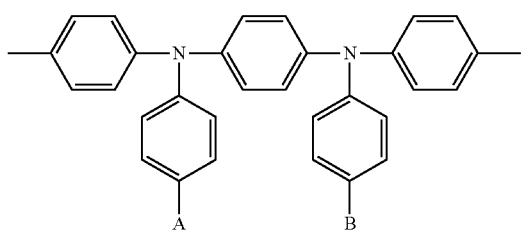

4

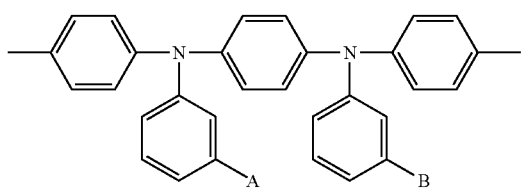

5

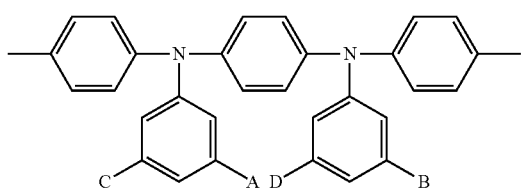

6 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl.

Particularly preferred hole transporting polymers of this type are AB copolymers of the first repeat unit and a triarylamine repeat unit.

a copolymer comprising a first repeat unit and heteroarylene repeat unit may be utilised for charge transport or emission. Preferred heteroarylene repeat units are selected from formulae 7-21:

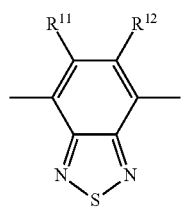
wherein $R^{11}$ and $R^{12}$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R^6$ and $R^7$ are preferably the same. More preferably, they are the same and are each a phenyl group.
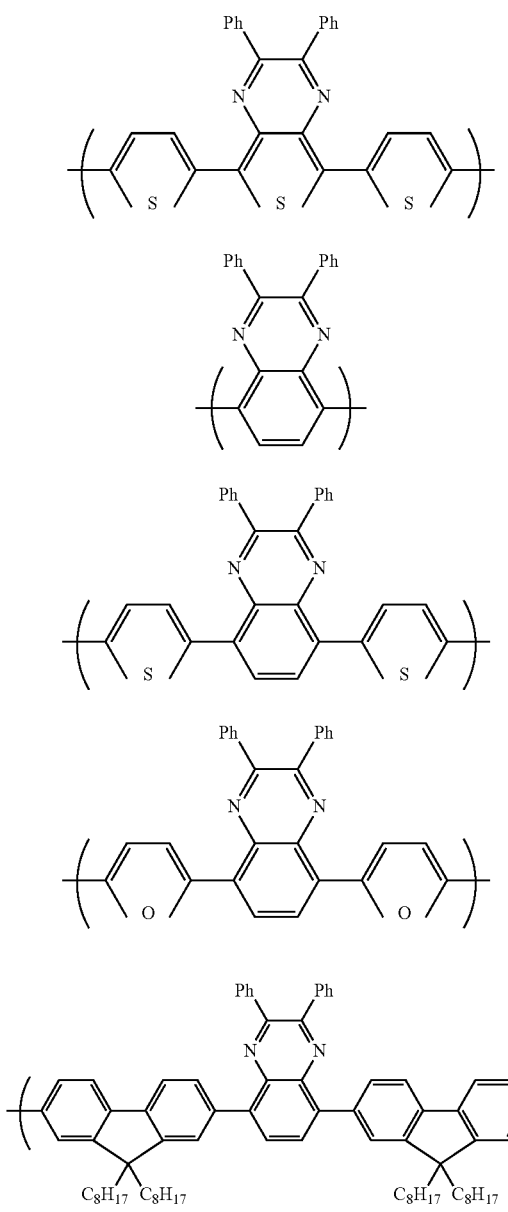
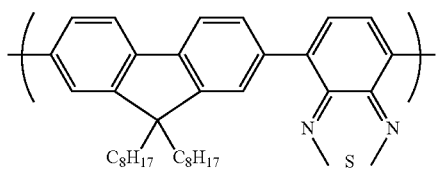
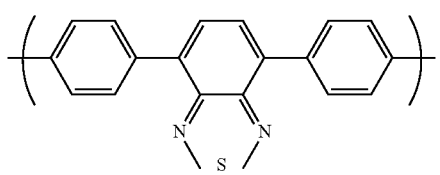
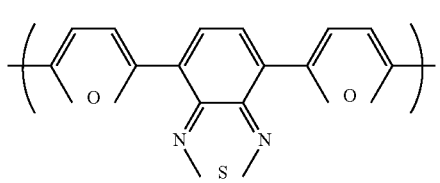
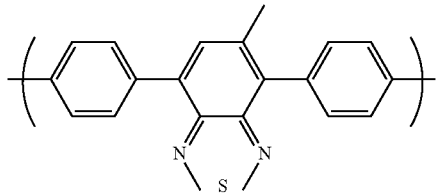
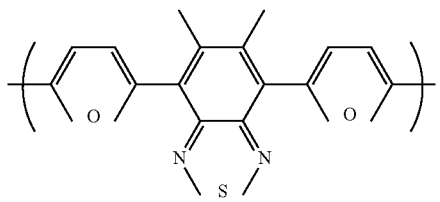
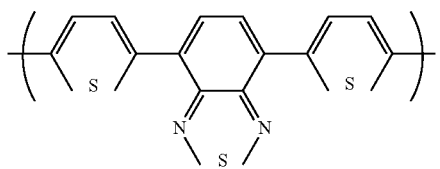
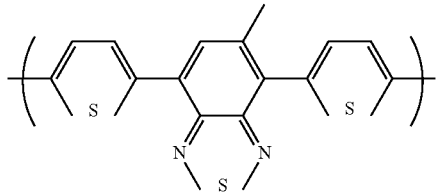
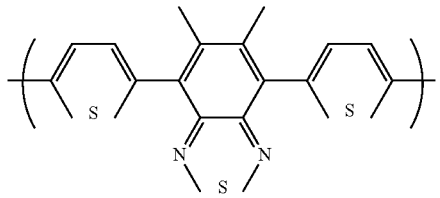

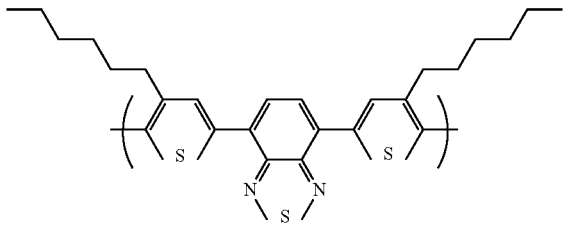

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable Π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

In this specification, where we discuss or mention "colours" of emitting materials, we adhere to the following definitions except where the context requires deviation.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 500-580 nm, preferably 510-570 nm.

By "blue electroluminescent material" is meant an organic material that by electroluminescence emits radiation having a wavelength in the range of 400-500 nm, more preferably 430-500 nm.

A single polymer or a plurality of polymers may be deposited from solution to form layer 3. Suitable solvents for polyarylenes, in particular polyfluorenes, include mono- or poly-alkylbenzenes such as toluene and xylene. Particularly preferred solution deposition techniques are spin-coating, slot-dye coating, and inkjet printing.

Spin-coating or slot-dye coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

Other solution deposition techniques include dip-coating, relief printing, roll printing and screen printing.

Clearly it is desirable to be able to utilise solution processing methods to lay down successive layers of an electroluminescent device. However, this has heretofore proved problematic because of the similarity of materials used in at some adjacent layers. Thus a first layer can become corrupted when a second layer is applied thereto.

Many of the compounds used to construct the layers are composed of similar skeletons, inevitably meaning that they are soluble in similar solvents and their solubilities are also similar. Thus, when a solution of a first compound is applied, via a solution processing technique such as inkjet printing or spin coating, to a dry layer of a second compound, in order to create a new layer, at least some of the dry layer may be dissolved in the solvent. This causes the new layer and the dry layer to mix, leading in turn to a decrease in device efficiency. This has led workers in the field to seek different techniques to apply successive layers of similar materials or to abandon one or other of the hole transport or electron transport layers. Some, indeed, have included organic compounds having dual functionality, such as those capable of both electron transport and hole transport.

The present invention provides a method for solution processing successive adjacent layers in an organic electronic device, and materials therefore.

In a first aspect, the invention relates to an organic electronic device comprising a first layer comprising a fluorinated first organic compound having one or more fluorene residues and being soluble in a fluorinated solvent, the first layer adjacent a second layer comprising a second organic compound being insoluble in a fluorinated solvent.

Preferably, the first organic compound is a conductive or semiconductive compound. It may be, for example, oligomeric or polymeric.

In certain embodiments, the first organic compound comprises the structure:

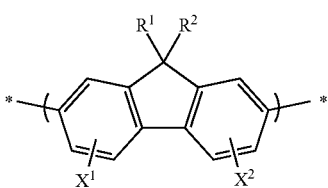

where $R^1$ and $R^2$ may be the same or different and may comprise a hydrogen, a halogen or a substituent or substituent group including optionally substituted alkyl, alkenyl, alkynyl or aryl groups; and $X^1$ and $X^2$ independently comprise hydrogen, a halogen or a substituent group including optionally substituted alkyl, alkenyl, alkynyl or aryl groups, and wherein at least one of X1, X2, R1, R2 is fluorine or comprises a substituent group fully or partially substituted with fluorine.

In some embodiments at least one of $R^1$ and $R^2$ comprises fluorine. In other embodiments at least one of $R^1$ and $R^2$ comprises a substituent group partially or fully substituted with fluorine residues.

In some embodiments at least one of $X^1$ and $X^2$ comprises fluorine. In other embodiments at least one of $X^1$ and $X^2$ comprises a substituent group partially or fully substituted with fluorine residues.

Preferably, the fluorine substituents make up at least 10 w/w % (for example 10w/w % to 85 w/w %) of the molecular mass of the first compound.

Preferably, the second organic material comprises a second organic compound of which fluorine comprises less than 10 w/w %, e.g. less than 5 w/w % of its molecular mass and is preferably fluorine-free. The second organic compound is preferably a conductive or semiconductive compound, and may be, for example, oligomeric or polymeric.

The second organic compound may comprise the structure:

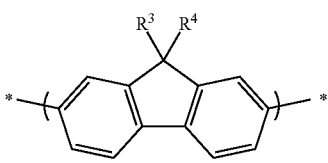

Where $R^3$ and $R^4$ may be the same or different and may comprise a hydrogen or a substituent or substituent group including optionally substituted alkyl, alkenyl, alkynyl or aryl groups, wherein the second organic compound is substantially fluorine free.

Preferably, the first solvent is a fluorinated solvent, for example a fluorinated solvent selected from a group consisting of: fluoroalkanes, for example fluorooctanes, fluorononanes, fluorodecanes and fluorocyclohexyl methyl decalines, or fluoroaromatics such as fluorotoluenes and fluoroxylenes. Alternatively, the fluorinated solvent comprises the structure:

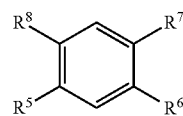

wherein $R^5$ to $R^8$ independently comprise fluorine, hydrogen or a substituent group including optionally substituted (e.g. optionally fluorinated) alkyl, alkenyl, alkynyl or aryl groups where at least one of $R^5$ to $R^8$ does not comprise hydrogen. Preferably, the substituent groups are substituted with one or more fluorine substituents.

Preferably, the second solvent is a substantially non-fluorinated solvent, for example a non-fluorinated solvent selected from the group consisting of aromatic solvents such as toluene and xylene or mixtures thereof.

Preferably, the first layer comprises an electron transport layer for transporting electrons from a cathode to an emitting layer.

Preferably, the second layer comprises an emitting layer for emitting electromagnetic radiation. The electromagnetic radiation is preferably in the range 300 nm to 800 nm. More preferably, the electromagnetic radiation is in one of the ranges 400 nm to 500 nm, 510 nm to 580 nm, 600 nm to 750 nm.

In a further aspect, the invention relates to an electroluminescent device comprising an organic electronic device as herein described.

In a further aspect, the invention relates to a photoluminescent device comprising an organic electronic device as herein described.

In a further aspect, the invention relates to an optical display device comprising an organic electronic device as herein described.

In another aspect, the invention relates to a solution for forming a conducting or semiconducting layer of an organic electronic device, the solution comprising a fluorinated solvent and a solute comprising a fluorinated first organic compound having one or more fluorene residues.

Preferably, the first organic compound is a conductive or semiconductive compound, and may be, for example, oligomeric or polymeric.

Preferably, the fluorinated solvent is selected from a group consisting of: fluoroalkanes, for example fluorooctanes, fluorononanes, fluorodecanes and fluorocyclohexyl methyl decalines, or fluoroaromatics such as fluorotoluenes and fluoroxylenes. Alternatively, the fluorinated solvent comprises the structure:

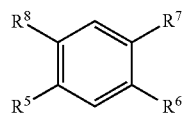

wherein $R^5$ to $R^8$ independently comprise fluorine, hydrogen or a substituent group including optionally substituted (e.g. optionally fluorinated) alkyl, alkenyl, alkynyl or aryl groups where at least one of $R^5$ to $R^8$ does not comprise hydrogen. Preferably, the substituent groups are partially or fully substituted with fluorine residues.

In a further aspect, the invention relates to a method of forming an organic electronic device comprising applying a layer of a solution comprising a fluorinated solvent and a solute comprising a fluorinated first organic compound having one or more fluorene residues to a substrate to form a first layer, the substrate comprising a second layer comprising a second organic compound, the first layer so-formed to be adjacent to and in intimate contact with the second layer.

In a further aspect, the invention relates to an electron transport material comprising a fluorinated organic compound having one or more fluorene residues.

In a further aspect, the invention provides an electroluminescent device comprising a fluorinated electron transport layer adjacent a non-fluorinated emitter layer.

In another aspect, the invention provides an electroluminescent emitting material comprising a fluorinated organic compound having one or more fluorene residues.

In order that the invention may be more fully understood, it will now be described by way of example only with reference to the accompanying drawings, in which.

Figure 1:
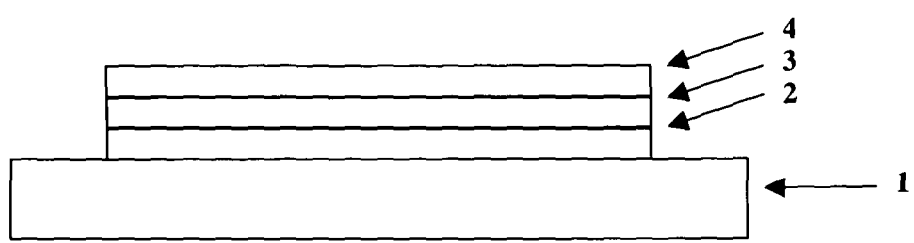
FIG. 1 shows an electroluminescent device according to the prior art.
Figure 2:
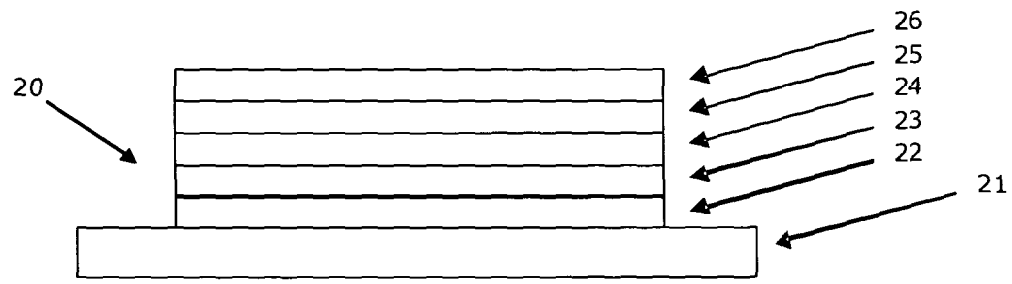
FIG. 2 shows an electroluminescent device according to the invention.

A silver anode 22 was deposited onto a glass substrate 21, by methods known in the art. A hole injection layer 23 of PEDOT:PSS was then deposited on the anode 22.

An emissive layer 24 was deposited atop the by spin coating of a 1 w/w % solution of poly(9-dioctyl fluorene) in ortho-xylene.

A 1 w/w % solution of poly(9-diperfluorooctyl fluorene) in trifluoro toluene was spin coated onto the emissive layer 24 to form an electron transport layer 25. The electron transport layer 25 formed evenly on the emissive layer 24, without any significant dissolution of the emissive layer 24.

Finally, a silver cathode 26 was deposited onto the electron transport layer 25 to provide a complete electroluminescent device.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of forming an organic electronic device comprising a first layer comprising a fluorinated first organic compound having one or more fluorene residues, the first layer adjacent a second layer comprising a fluorine-free second organic compound, the method comprising:
   depositing a second solution comprising a second solvent to form the second layer; and
   depositing a first solution comprising the fluorinated first organic compound and a first fluorinated solvent on the second layer to form the first layer,
   wherein the second organic compound is insoluble in the first fluorinated solvent, wherein the second organic compound is a conductive or semiconductive compound, and wherein the second solvent is an organic solvent.

2. A method according to claim 1, wherein the first organic compound is a conductive or semiconductive compound.

3. A method according to claim 1, wherein the first organic compound comprises structure (I):

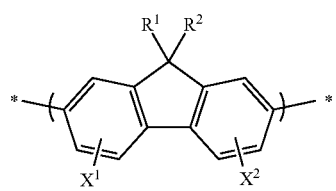

(I)

wherein $R^1$ and $R^2$ are the same or different and comprise a hydrogen, a halogen, or a substituent or substituent group including optionally substituted alkyl, alkenyl, alkynyl, or aryl groups, wherein $X^1$ and $X^2$ independently comprise a hydrogen, a halogen, or a substituent group including optionally substituted alkyl, alkenyl, alkynyl, or aryl groups, and wherein at least one of $X^1$, $X^2$, $R^1$, and $R^2$ is fluorine or comprises a substituent group fully or partially substituted with fluorine.

4. A method according to claim 3, wherein at least one of $R^1$ and $R^2$ comprises fluorine.

5. A method according to claim 3, wherein at least one of $R^1$ and $R^2$ comprises a substituent group partially or fully substituted with fluorine.

6. A method according to claim 3, wherein at least one of $X^1$ and $X^2$ comprises fluorine.

7. A method according to claim 3, wherein at least one of $X^1$ and $X^2$ comprises a substituent group partially or fully substituted with fluorine.

8. A method according to claim 1, wherein the fluorine substituents of the first organic compound make up at least 10 w/w % of the molecular mass of the first organic compound.

9. A method according to claim 1, wherein the second organic compound comprises structure (II):

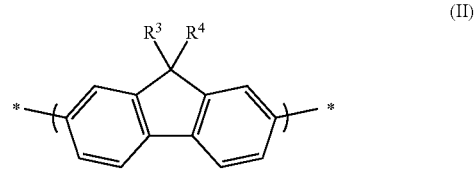

(II)

wherein $R^3$ and $R^4$ are the same or different and comprise a hydrogen or a substituent or substituent group including optionally substituted alkyl, alkenyl, alkynyl, or aryl groups.

10. A method according to claim 1, wherein the first fluorinated solvent is selected from the group consisting of fluoroalkanes and fluoroaromatics.

11. A method according to claim 1, wherein the first solvent comprises structure (III):

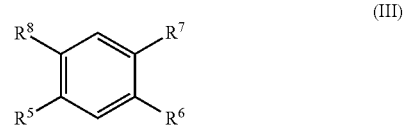

(III)

wherein $R^5$ to $R^8$ independently comprise fluorine, hydrogen, or a substituent group including optionally substituted alkyl, alkenyl, alkynyl, or aryl groups, wherein at least one of $R^5$ to $R^8$ does not comprise hydrogen.

12. A method according to claim 11, wherein the substituent groups are substituted with one or more fluorine substituents.

13. A method according to claim 1, wherein the second solvent is a substantially non-fluorinated solvent.

14. A method according to claim 1, wherein the first layer comprises an electron transport layer for transporting electrons from a cathode to an emitting layer.

15. A method according to claim 1, wherein the second layer comprises an emitting layer for emitting electromagnetic radiation.

16. A method according to claim 15, wherein the electromagnetic radiation is in the range from 300 nm to 800 nm.

17. A method according to claim 2, wherein the first organic compound is oligomeric or polymeric.

18. A method according to claim 1, wherein the second organic compound is oligomeric or polymeric.

19. A method according to claim 10, wherein the fluoroalkanes are selected from the group consisting of fluorooctanes, fluorononanes, fluorodecanes, and fluorocyclohexyl methyl decalines.

20. A method according to claim 10, wherein the fluoroaromatics are selected from the group consisting of fluorotoluenes and fluoroxylenes.

21. A method according to claim 13, wherein the second solvent is an aromatic solvent.

22. A method according to claim 21, wherein the aromatic solvent is selected from the group consisting of toluene, xylene, and mixtures thereof.

23. A method according to claim 1, wherein the organic electronic device is an electroluminescent device.

* * * * *